United States Patent
Pei et al.

(10) Patent No.: US 10,260,144 B2
(45) Date of Patent: Apr. 16, 2019

(54) EVAPORATION CRUCIBLE AND EVAPORATION DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fengwei Pei, Beijing (CN); Ziyi Zhao, Beijing (CN)

(73) Assignees: BOE TECHNOLOGY GROUP CO., LTD., Beijing (CN); ORDOS YUANSHENG OPTOELECTRONICS CO., LTD., Ordos Inner Mongolia (CN)

( * ) Notice: Subject to any disclaimer, the term of this patent is extended or adjusted under 35 U.S.C. 154(b) by 295 days.

(21) Appl. No.: 15/131,496

(22) Filed: Apr. 18, 2016

(65) Prior Publication Data

US 2016/0305010 A1 Oct. 20, 2016

(30) Foreign Application Priority Data

Apr. 20, 2015 (CN) .......................... 2015 1 0189024

(51) Int. Cl.
*C23C 16/00* (2006.01)
*C23C 14/24* (2006.01)

(52) U.S. Cl.
CPC ................... *C23C 14/243* (2013.01)

(58) Field of Classification Search
CPC .................................................. C23C 14/243
USPC .................................................. 118/726, 727
See application file for complete search history.

(56) References Cited

U.S. PATENT DOCUMENTS

| | | | | |
|---|---|---|---|---|
| 2,665,228 A * | 1/1954 | Stauffer | ................. | C23C 14/02 118/59 |
| 3,850,679 A * | 11/1974 | Sopko | ..................... | C03C 17/00 118/718 |
| 4,707,333 A * | 11/1987 | Gardiner | ............... | C23C 14/246 266/200 |
| 2002/0067917 A1* | 6/2002 | Takamatsu | .......... | C23C 16/4404 392/388 |
| 2003/0111014 A1* | 6/2003 | Donatucci | ........... | C23C 16/4485 118/726 |
| 2004/0115338 A1* | 6/2004 | Yoneda | ................. | C23C 14/042 427/66 |

(Continued)

FOREIGN PATENT DOCUMENTS

| | | |
|---|---|---|
| CN | 203530417 U | 4/2014 |
| JP | 2013001927 A | 1/2013 |
| KR | 1020110082820 A | 7/2011 |

OTHER PUBLICATIONS

First Chinese Office Action dated Oct. 28, 2016; Appln. No. 201510189024.0.

(Continued)

*Primary Examiner* — Keath T Chen
(74) *Attorney, Agent, or Firm* — Ladas & Parry LLP

(57) ABSTRACT

An evaporation crucible and an evaporation device are provided. The evaporation crucible includes a crucible body and a plurality of nozzles connected to the crucible body, wherein at least one of the nozzles is provided with a nozzle heating structure at a periphery thereof. The evaporation device includes the above-mentioned evaporation crucible.

13 Claims, 6 Drawing Sheets

(56) References Cited

U.S. PATENT DOCUMENTS

| | | | | |
|---|---|---|---|---|
| 2004/0255857 | A1* | 12/2004 | Chow | C23C 14/243 |
| | | | | 118/715 |
| 2005/0000425 | A1* | 1/2005 | Fairbourn | C23C 16/029 |
| | | | | 118/715 |
| 2005/0039684 | A1* | 2/2005 | Yi | C23C 14/12 |
| | | | | 118/726 |
| 2005/0244580 | A1* | 11/2005 | Cok | C23C 14/12 |
| | | | | 427/248.1 |
| 2011/0045166 | A1* | 2/2011 | Shimmura | C23C 16/24 |
| | | | | 427/8 |
| 2012/0285381 | A1* | 11/2012 | Dussert-Vidalet | |
| | | | | C23C 16/4557 |
| | | | | 118/726 |
| 2013/0320025 | A1* | 12/2013 | Mazzetta | A47G 23/0683 |
| | | | | 220/574 |
| 2014/0193661 | A1* | 7/2014 | Steele | B01D 39/2027 |
| | | | | 428/613 |

OTHER PUBLICATIONS

Second Chinese Office Action dated Mar. 2, 2017; Appln. No. 201510189024.0.

* cited by examiner

EVAPORATION CRUCIBLE AND EVAPORATION DEVICE

TECHNICAL FILED

Embodiments of the present invention relate to an evaporation crucible and an evaporation device.

BACKGROUND

At present, manufacture method of organic light-emitting diode (OLED) display usually utilizes a fine metal mask (FMM) in combination with a low temperature poly-silicon (LTPS) panel, including: applying an organic material onto a LTPS backplane by evaporation method and then forming red, green and blue light-emitting elements by means of patterns pre-arranged on the FMM, wherein the evaporation method is performed within a vacuum chamber by using a linear evaporation crucible.

During the evaporation process, a linear evaporation source plays a crucial role to evaporate the organic material as a film layer; consequently, existing technology usually focuses on the linear evaporation source per se rather than a design of the crucible for use with the linear evaporation source.

SUMMARY

Embodiments of the present invention provide an evaporation crucible and an evaporation device which can solve technical problems of existing technology that the evaporation material having been cooled during the evaporation process may block the nozzle and hence increase the production cost and reduce the production efficiency, and that the reflowing of the evaporation material having been cooled may result in poor uniformity of the film layer as formed.

Embodiments of the present invention provide an evaporation crucible, comprising a crucible body and a plurality of nozzles connected to the crucible body, wherein at least one of the nozzles is provided with a nozzle heating structure at a periphery thereof.

Embodiments of the present invention further provide an evaporation device comprising the above-mentioned evaporation crucible.

BRIEF DESCRIPTION OF THE DRAWINGS

Embodiments of the present invention will be described in more detail as below with reference to the accompanying drawings to enable those skilled in the art to understand the present invention more clearly, wherein.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Figure 1:
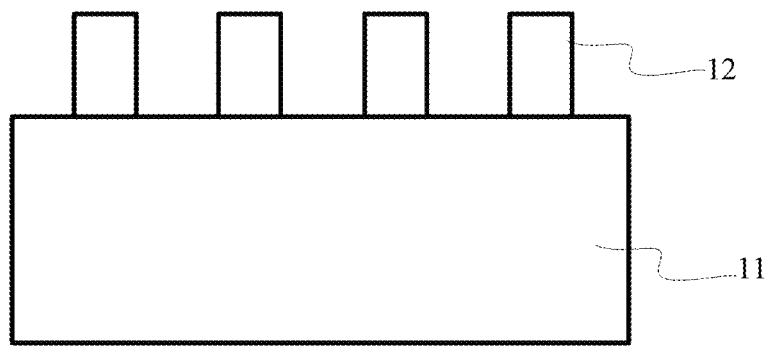
FIG. 1 is a schematic diagram illustrating a cross-sectional structure of an evaporation crucible.

Referring to FIG. 1, an evaporation crucible for use in a manufacture method of OLED display includes a crucible body 11 and a nozzle 12, wherein the crucible body is provided with a heating device but the nozzle is not; as a result, an evaporation material is likely to be deposited at a nozzle exit during the evaporation process, which leads to a blockage in the nozzle, negatively influencing an evaporation rate and thus increasing an evaporation duration. In order to avoid a blockage in the nozzle of crucible that is usually occurred in exiting technology, it requires frequently cleaning the crucible, which may cause a waste of huge manpower and material resources, resulting in increased production cost and reduced production efficiency. In addition, during the evaporation process, a portion of the evaporation material may be reflowing into the crucible upon cooled at the nozzle exit, and may be re-evaporated in a form of macromolecule or molecular group by heating, which may influence an uniformity of resulting film layer; furthermore, the material having been evaporated once by heating is usually tending to partly modified in its property, thus a second evaporation of such kind of reflowed material may influence a performance of the film layer in display devices.

At least one embodiment of the present invention provides an evaporation crucible and an evaporation device which can solve the technical problems that the evaporation material having been cooled during the evaporation process may block the nozzle and hence increase the production cost and reduce the production efficiency, and that the reflowing of the evaporation material having been cooled may result in poor uniformity of the film layer as formed.

First Embodiment

Figure 2:
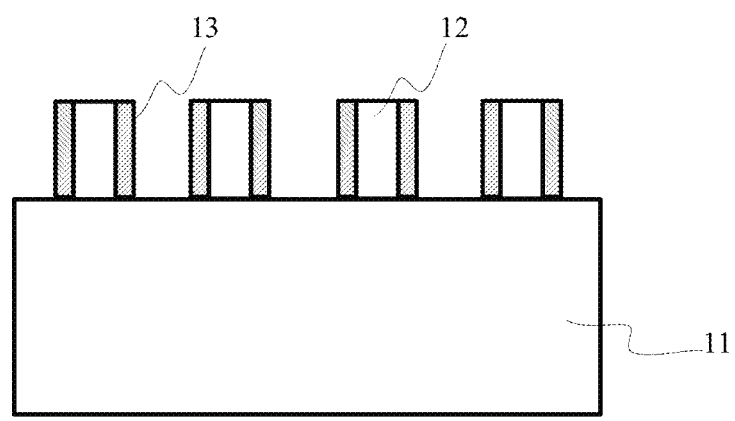
FIG. 2 is a schematic diagram illustrating a cross-sectional structure of an evaporation crucible as provided by an embodiment of the present invention.

An evaporation crucible as provided by a first embodiment of the present invention is illustrated in FIG. 2, including: a crucible body 11 and a plurality of nozzles 12 connected to the crucible body 11, wherein at least one of the nozzles 12 is provided with a nozzle heating structure 13 at a periphery thereof.

With the evaporation crucible as provided by the present embodiment, a heating temperature for heating the nozzle through the nozzle heating structure 13 can be set as a melting point of the evaporation material. For example, in case that the melting point of the evaporation material in the crucible body is 200° C., the heating temperature of the nozzle heating structure 13 can be controlled at 200° C., so as to ensure that the evaporation material is always at a molten state in the nozzle and will not be solidified due to excessively low temperature which may block the nozzle exit or be subjected to a second evaporation due to excessively high temperature which may influence an uniformity of the film layer as formed.

In an example of the present embodiment, a heating net can be used as the nozzle heating structure 13. The heating net allows uniform heating of the nozzle as compared with, for example, a heating ring.

The evaporation crucible as provided by the first embodiment of the present invention includes a crucible body and a plurality of nozzles connected to the crucible body, wherein at least one of the nozzles is provided with a nozzle heating structure at a periphery thereof. Because of the nozzle heating structure arranged at the periphery of the nozzle, the nozzle can be heated by the nozzle heating structure so that the material will no longer be deposited at the nozzle exit during the evaporation process; in this way, it avoids the condition where an ejecting rate of the evaporation material may be influenced by a blockage in the nozzle due to material deposited at the nozzle exit, and correspondingly avoids the technical problem of low evaporation rate.

Second Embodiment

Figure 3:
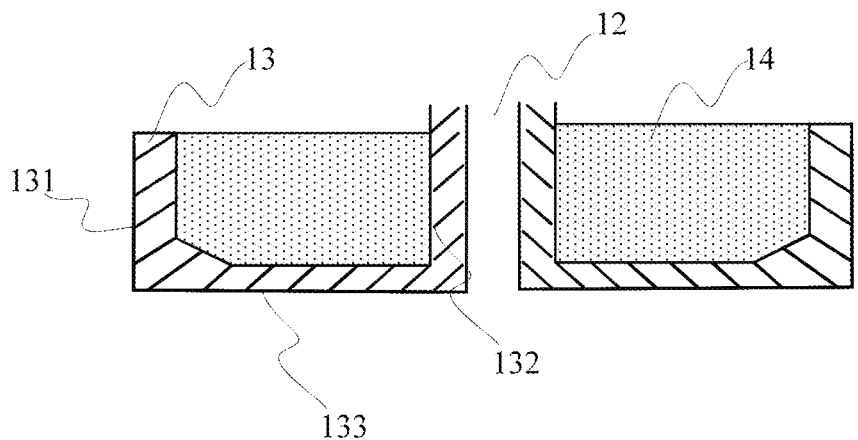
FIG. 3 is a schematic diagram illustrating a cross-sectional structure of an evaporation crucible as provided by another embodiment of the present invention.

An evaporation crucible as provided by the second embodiment of the present invention is illustrated in FIG. 3, including not only the crucible body 11, the plurality of nozzles 12 connected to the crucible body 11 and the nozzle heating structure 13 arranged at the periphery of at least one of the nozzles 12, but also a storage device 14 disposed at the nozzle heating structure 13, wherein the storage device 14 is configured to store evaporation material having been cooled during the evaporation process.

Referring to FIG. 3, in an example of the present embodiment, the nozzle heating structure 13 is disposed to surround the nozzle 12 and is formed to be recessed towards the crucible body 11, and the storage device 14 can be disposed within the recessed-shaped nozzle heating structure 13. For example, the storage device 14 can be surrounded by side walls 131, 132 and bottom surface 133 of the recessed-shaped nozzle heating structure 13. A recessed-shaped nozzle heating structure increases an area of the storage device 14 subjecting to heating; in this way, during the evaporation process, the nozzle heating structure 13 allows uniform heating of the evaporation material in the storage device 14 so that the evaporation material can be always at a molten state, which facilitates the evaporation material to be flowing out of the storage device 14, for example, pouring from the storage device 14.

Figure 4:
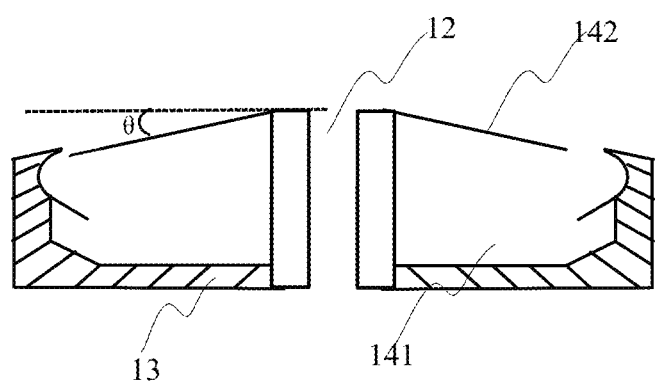
FIG. 4 is a schematic diagram illustrating a cross-sectional structure of a nozzle of the evaporation crucible as illustrated in FIG. 3.

Referring to FIG. 4, in an example of the present embodiment, the storage device 14 includes a storing chamber 141 and a guide plate 142 covering above the storing chamber 141; furthermore, in order to facilitate the evaporation material to be flowing into the storing chamber 141, the guide plate 142 is arranged to be oblique with respective to a top surface (a level plane in FIG. 4) of the nozzle exit. For example, in a side view of FIG. 4, the guide plate 142 seems to form an inverse "V" above the storing chamber 141. In an example, the guide plate 142 forms an inclined angle θ with respective to the level plane, for example, $3°≤θ≤8°$.

With the storage device including the storing chamber and the guide plate covering above the storing chamber, the guide plate can direct the evaporation material having been cooled outside the nozzle during the evaporation process to flow into the storing chamber while preventing the evaporation material in the storing chamber from being heated and evaporated for a second time; furthermore, the storing chamber can preserve the evaporation material having been cooled during the evaporation process and directed into the storing chamber.

Figure 5:
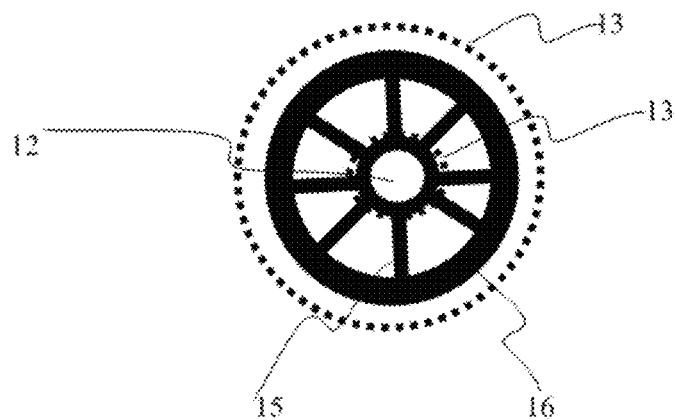
FIG. 5 is a schematic diagram illustrating a cross-sectional structure of a nozzle of the evaporation crucible as illustrated in FIG. 3 with a guide plate provided with a plurality of guide grooves thereon.

Referring to FIGS. 4-5, in an example of the present embodiment, one side of the guide plate 142 facing away the storing chamber 141 is provided with a plurality of external guide grooves 15. By arranging the plurality of external guide grooves at the side of the guide plate facing away the storing chamber, the evaporation material having been cooled outside the nozzle can be quickly flowing into the storing chamber along the external guide grooves so as to prevent the evaporation material from being solidified on the guide plate due to a retention on the guide plate for a long time.

In an example of the present embodiment, as illustrated in FIG. 5, the plurality of external guide grooves 15 are distributed radially about the nozzle 12 to allow the evaporation material having been cooled and distributed along any direction to quickly flow into the storing chamber along the plurality of external guide grooves 15, so as to prevent the evaporation material from being solidified due to a retention on the guide plate for a long time.

In an example of the present embodiment, each of the external guide grooves 15 has a width w which is half of an outside diameter of the nozzle 12, so as to ensure that the all the evaporation material outside the nozzle can be fully following into the groove during the evaporation process. Of course, in other examples the width w of the external guide groove can be larger or smaller than half of the outside diameter of the nozzle. However, it should be explained that an excessively smaller width of the external guide groove may result in that the cooled evaporation material will be overflowing from the external guide groove and further cooled until solidified on the guide plate, while an excessively larger width of the external guide groove may result in that an area of the cooled evaporation material contacting with the guide plate and the air will be increased so that the temperature of the evaporation material will be quickly lowered until solidified in the external guide groove, which may influence a fluid guide rate of the external guide groove. Therefore, the width of the external guide groove should be appropriately adjusted according to demands of practical operation.

Figure 6:
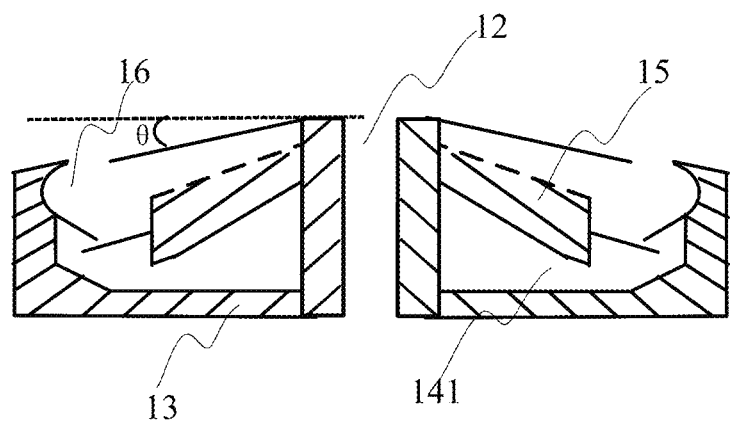
FIG. 6 is a top view illustrating a structure of the nozzle of the evaporation crucible as illustrated in FIG. 3.

In an example of the present embodiment, referring to FIG. 5 and FIG. 6, the evaporation crucible further includes a ring-shaped channel 16 connected to one end of each of the external guide grooves 15 facing away the nozzle 12 so as to collect the evaporation material from the guide grooves 15 and direct the collected evaporation material into the storing chamber.

Figure 7:
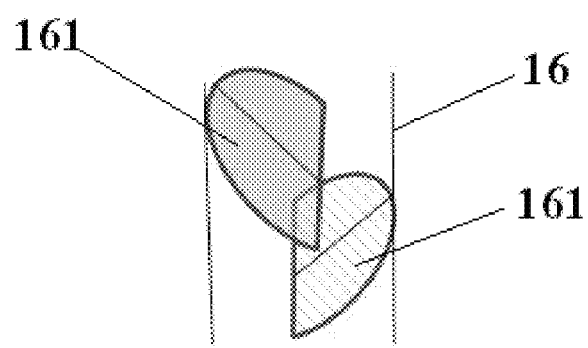
FIG. 7 is a schematic diagram illustrating a structure of a channel in the evaporation crucible as illustrated in FIG. 3.
Figure 8:
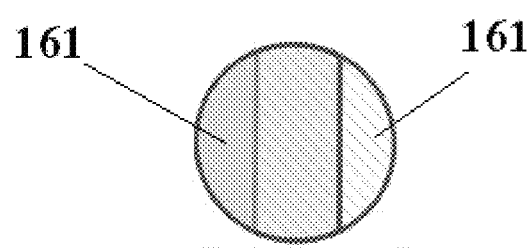
FIG. 8 is a top view illustrating a structure of the channel as illustrated in FIG. 7.

In an example of the present embodiment, referring to FIG. 7 and FIG. 8, the channel is provided with a plurality of baffles 161 which are arranged in a stagger manner so that the storing chamber can be completely covered from the above. By designing a channel provided with a plurality of baffles arranged in a stagger manner to completely cover the storing chamber from the above, it can efficiently prevent the evaporation material from being evaporated for a second time by heating which may influence the uniformity of the film layer of OLED. It should be explained that, although FIG. 7 and FIG. 8 merely illustrate 2 baffles 161 which are arranged to be partly overlapped with each other by way of example, embodiments of the present invention are not limited thereto. Those skilled in the art will be appreciated that the amount, shape, size and arrangement manner of such baffles can be appropriately adjusted as long as covering the storing chamber from the above as much as possible.

In an example of the present embodiment, in order to ensure sufficient space in the storing chamber for more evaporation material so as to eliminate the need of frequently removing the evaporation material from the storing device, and also in order to avoid an excessively larger storing chamber which may occupy spaces corresponding to other nozzles, an outer diameter of the channel can be designed as 3-5 times of the outer diameter of the nozzle. For example, the crucible can be designed to have structural parameters as below: the storing chamber has a height of 10 mm, the channel of the crucible has a depth of 6 mm, the external guide groove 15 has a width which is half of an outer diameter of the nozzle and has a depth of 2.5 mm.

Third Embodiment

Figure 9:
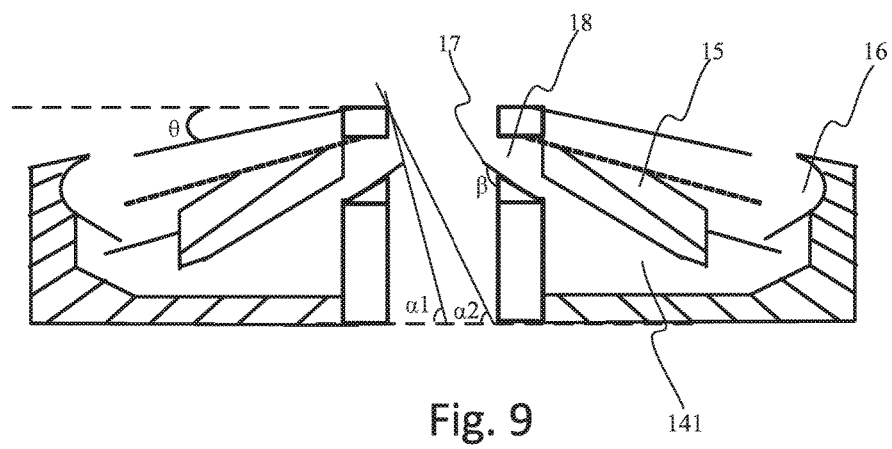
FIG. 9 is a schematic diagram illustrating a cross-sectional structure of a nozzle of an evaporation crucible as provided by yet another embodiment of the present invention.

An evaporation crucible as provided by a third embodiment of the present invention is illustrated in FIG. 9. As compared with the second embodiment, the evaporation crucible as provided by the present embodiment further includes a blocking plate 17 disposed within the nozzle at an end of the nozzle 12 far away from the crucible body 11, wherein the blocking plate 17 forms an obtuse angle β with a direction along which the evaporation material is flowing out of the nozzle 12, for example, an axial direction of the nozzle 12. Moreover, an internal fluid guiding channel 18 is disposed at where the blocking plate 17 is connected to the nozzle 12, and the internal fluid guiding channel 18 is formed to be penetrating through the nozzle 12.

By disposing the blocking plate within the nozzle at an end of the nozzle far away from the crucible body and by further arranging the blocking plate to have an obtuse angle with the direction along which the evaporation material is flowing out of the nozzle, it can prevent the evaporation material that is cooled by contacting with inner wall of the nozzle exit from reflowing into the crucible body, so as to solve the technical problem that the reflowed evaporation material is evaporated for a second time by heating and hence influences the performance of the film layer as formed; moreover, the evaporation material that is cooled in the nozzle can be directed to flow into the storing chamber by means of the internal guide groove penetrating through the interior of the nozzle so that the evaporation material is not likely to be deposited at the nozzle exit to block the nozzle which may influence the evaporation rate and increase the evaporation duration; in this way, the manpower and material resources for replacing and cleaning the crucible can be reduced, thereby reducing the production cost and improving the production efficiency.

In an example of the present embodiment, still referring to FIG. 9, in a cross-section view of the nozzle, defining an angle of a straight line connecting one end of the blocking plate 17 farthest from the crucible body 11 and one end of the nozzle 12 farthest from the crucible body 11 with respective to a level plane (e.g., a top surface of the nozzle exit) as a first included angle α1, and defining an angle of a diagonal line (that is, a line connecting one end of the nozzle 12 connected to the crucible body 11 and one end of the nozzle 12 farthest from the crucible body 11) in the cross-section with respective to the level plane (e.g., a top surface of the nozzle exit) as a second included angle α2, then the first included angle α1 shall be larger than the second included angle α2. Such design is given based on the reasons as below. During the evaporation process, the evaporation material being evaporated is ejected out of the nozzle at a certain angle; consequently, in order to ensure desired evaporation quality and rate, the blocking plate shall be arranged in such a manner that it does not interference with the ejection of the evaporation material; by arranging the first included angle α1 to be larger than the second included angle α2, the blocking plate has no way of hindering the exit of the evaporation material and the evaporation material can be ejected out of the nozzle at any possible angle so as to ensure normal evaporation process. In addition, in order to prevent the evaporation material that is cooled in the interior of the nozzle exit from reflowing into the crucible body, the first included angle α1 shall be close to the second included angle α2 as much as possible; in other words, a straight line connecting the end of the blocking plate 17 farthest from the crucible body and the end of the nozzle 12 farthest from the crucible body shall be close to one of the diagonal lines of the cross-section of the nozzle having an inclined direction identical with the straight line, as much as possible.

Fourth Embodiment

Figure 10:
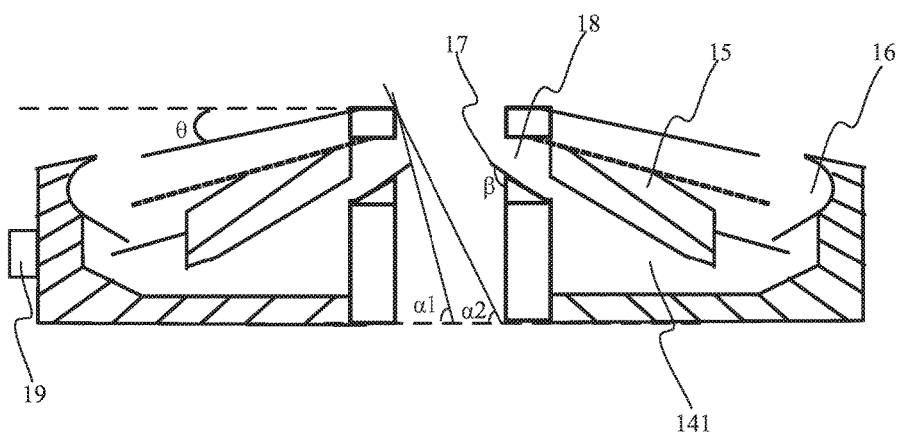
FIG. 10 is a schematic diagram illustrating a cross-sectional structure of a nozzle of an evaporation crucible as provided by still another embodiment of the present invention.

An evaporation crucible as provided by a fourth embodiment of the present invention is illustrated in FIG. 10; as compared with the third embodiment, the evaporation crucible as provided by the present embodiment further includes a temperature sensor 19 disposed outside the storing device and configured to measure a temperature inside the storing device.

By arranging the temperature sensor outside the storing device, it can measure the temperate inside the storing device in real time so as to heat the evaporation material contained in the storing chamber with the nozzle heating structure in good time to maintain a molten state thereof; in this way, it's convenient for the evaporation material to be flowing out of the storing chamber, and it also avoids an excessively higher temperature which may cause the evaporation material to be sublimated and hence negatively influences an uniformity of the film layer as formed.

Figure 11:
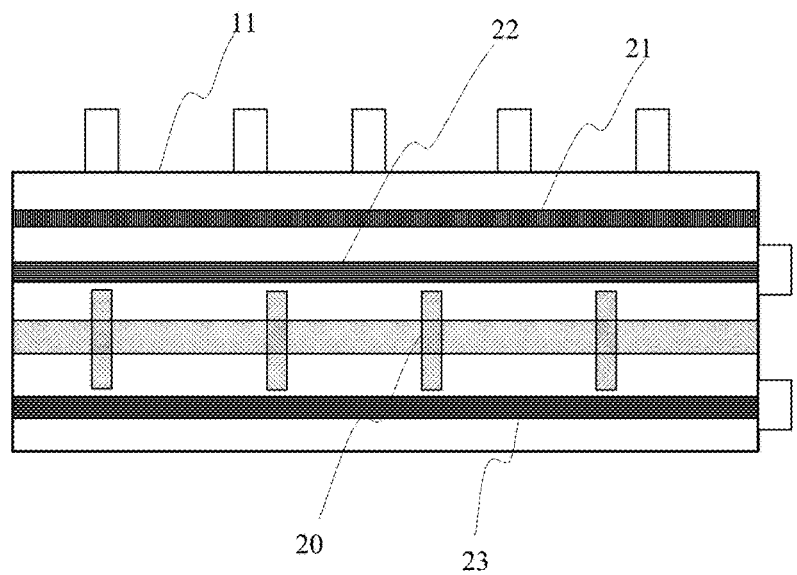
FIG. 11 is a schematic diagram illustrating a cross-sectional structure of a crucible body of the evaporation crucible as illustrated in FIG. 8.

In an example of the present embodiment, the crucible body can include a division plate to divide the interior of the crucible body into a plurality of compartments. Referring to FIG. 11, for example, the division plate can be a grid-structured division plate 20 including a plurality of strips which are arranged in a grid, wherein the strips arranged lengthways (i.e., the vertically arranged strips as illustrated in FIG. 11) each can be disposed below the nozzles, corresponding to a location between two adjacent nozzles.

In order to prevent the evaporation material from being solidified due to poor heat conduction, in an example the grid-structured division plate 20 can be formed from a metal having good thermal conductivity such as copper. However, copper is poor in hardness and likely to be deformed during cleaning. In another example, the grid-structured division plate 20 can be formed from copper-nickel alloy material which has advantageous such as good thermal conductivity and high hardness so as to increase the thermal conductivity and stability of the grid-structured division plate 20, which can facilitate an improvement in the uniformity of the film layer as formed and an increase in the service life of the evaporation crucible. Of course, in other examples the grid-structured division plate 20 can be formed from other metallic or alloy materials which have high thermal conductivity and less likely to be deformed.

Figure 12:
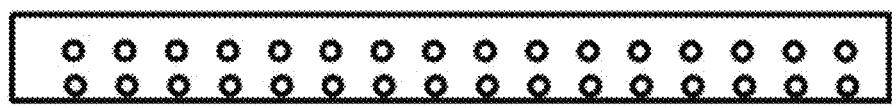
FIG. 12 is a schematic diagram illustrating a planar structure of an airflow balance plate of the evaporation crucible as illustrated in FIG. 8.

In the present embodiment, the crucible body can further include an air balance plate 21 disposed above the grid-structured division plate 20. Referring to FIG. 11, the air balance plate 21 can also be formed from copper-nickel alloy material, in order to increase the thermal conductivity and to prevent the evaporation material from being solidified on the air balance plate due to poor thermal conductivity which may influence the uniformity of the film layer as formed. For example, the air balance plate 21 can be designed to be porous, as illustrated in FIG. 12, so as to allow the material to be evaporated at a relatively larger amount but not in an excessively intense manner.

Moreover, in the present embodiment, the crucible body 11 can further comprise a top heating ring 22 disposed above the grid-structured division plate 20 and a bottom heating ring 23 disposed beneath the grid-structured division plate 20 to further heat and evaporate the material in the crucible body 11.

Additionally, in the present embodiment, in order to maintain a constant ejecting rate of the evaporation material, the crucible body 11 can further include a temperature sensor configured to measure an internal temperature of the crucible body 11 so as to allow the evaporation material to be evaporated under a constant temperature and hence to be ejected at a constant rate.

As above, at least one embodiment of the present invention provides an evaporation crucible comprising a crucible body and a plurality of nozzles connected to the crucible body, wherein at least one of the nozzles is provided with a nozzle heating structure at a periphery thereof. Because of the nozzle heating structure surrounding the nozzle, the nozzle can be heated to prevent the evaporation material from being deposited at the nozzle exit which may block the nozzle and hence influence the ejection rate of evaporation material. Additionally, in various embodiments, the crucible the evaporation crucible can further comprise the guide plate with external guide grooves thereon which are disposed obliquely with respective to the top surface of the nozzle exit, the blocking plate disposed within the nozzle at an end of the nozzle far away from the crucible body, and the internal guide grooves which is disposed at where the blocking plate is connected to the nozzle and is formed to be penetrating through the nozzle; so as to direct the evaporation material having been cooled outside the nozzle or having been cooled inside the nozzle exit to flow into the storing chamber during the evaporation process, and hence to prevent the evaporation material from blocking the nozzle or being evaporated for a second time by heating or reflowing into the crucible body; thereby solving the above-mentioned technical problems in the exiting technology concerning the production cost, the production efficiency and the uniformity of the film layer as formed.

It is understood that the described above are just exemplary implementations and embodiments to explain the principle of the present invention and the invention is not intended to be limited thereto. An ordinary person in the art can make various variations and modifications to the present invention without departure from the spirit and the scope of the present invention, and such variations and modifications shall fall in the scope of the present invention.

The present application claims the priority of China patent application No. 201510189024.0 filed on Apr. 20, 2015 titled "EVAPORATION CRUCIBLE AND EVAPORATION DEVICE", which is incorporated herein by reference in its entirely.

What is claimed is:

1. An evaporation crucible, comprising a crucible body and a plurality of nozzles connected to the crucible body, wherein at least one of the nozzles is provided with a nozzle heating structure at a periphery thereof, wherein
    the nozzle heating structure is formed to be recessed towards the crucible body,
    the evaporation crucible further comprises a storing chamber surrounded by the nozzle heating structure, the storing chamber is isolated from the crucible body without fluid communication and is configured to store an evaporation material which is cooled outside the nozzle during an evaporation process,
    a guide plate is further disposed above the storing chamber to cover the storing chamber, one side of the guide plate facing away the storing chamber is provided with a plurality of external guide grooves each having one end closer to the nozzle and the other end farther from the nozzle,
    a ring-shaped channel is directly connected with the end of each of the external guide grooves farther from the nozzle, and is configured to collect the evaporation material from the external guide grooves and direct the collected evaporation material into the storing chamber.

2. The evaporation crucible of claim 1, wherein, in a plan view, the plurality of guide grooves are arranged radially about the nozzle.

3. The evaporation crucible of claim 1, wherein a width of the guide groove is a half of an outer diameter of the nozzle.

4. The evaporation crucible of claim 1, wherein the channel is provided with a plurality of baffles which are arranged in a stagger manner.

5. The evaporation crucible of claim 1, wherein an outer diameter of the channel is 3-5 times of an outer diameter of the nozzle.

6. The evaporation crucible of claim 1, wherein,
    a blocking plate is disposed within the nozzle at one end of the nozzle far away from the crucible body, wherein the blocking plate forms an obtuse angle with respective to an axial direction of the nozzle; and an internal guide groove is disposed where the blocking plate is connected to the nozzle and is formed to penetrate through the nozzle.

7. The evaporation crucible of claim 6, wherein in a cross section of the nozzle, a straight line connecting one end of the blocking plate far away from the crucible body and one end of the nozzle far away from the crucible body forms a first included angle with respective to a top surface of a nozzle exit; and a diagonal line in the cross section of the nozzle forms a second included angle with respective to the top surface of the nozzle exit, wherein, the first included angle is larger than the second included angle.

8. The evaporation crucible of claim 1, further comprising a temperature sensor disposed outside of the storing chamber.

9. The evaporation crucible of claim 1, wherein the crucible body comprises a grid-structured division plate to divide an interior of the crucible body into a plurality of compartments and an air balance plate disposed above the division plate, wherein the division plate and the air balance plate are both formed of copper-nickel alloy material.

10. An evaporation device, comprising an evaporation crucible, wherein the evaporation crucible comprises a crucible body and a plurality of nozzles connected to the crucible body, wherein at least one of the nozzles is provided with a nozzle heating structure at a periphery thereof, wherein the nozzle heating structure is formed to be recessed towards the crucible body, the evaporation crucible further comprises a storing chamber surrounded by the nozzle heating structure, the storing chamber is isolated from the crucible body without fluid communication and is configured to store an evaporation material which is cooled outside the nozzle during an evaporation process, a guide plate is further disposed above the storing chamber to cover the storing chamber, one side of the guide plate facing away the storing chamber is provided with a plurality of external guide grooves each having one end closer to the nozzle and the other end farther from the nozzle, a ring-shaped channel is directly connected with the end of each of the external guide grooves farther from the nozzle, and is configured to collect the evaporation material from the external guide grooves and direct the collected evaporation material into the storing chamber.

11. The evaporation device of claim 10, wherein, a blocking plate is disposed within the nozzle at one end of the nozzle far away from the crucible body, wherein the blocking plate forms an obtuse angle with respective to an axial direction of the nozzle; and an internal guide groove is disposed where the blocking plate is connected to the nozzle and is formed to be penetrating through the nozzle.

12. The evaporation device of claim 11, wherein in a cross section of the nozzle, a straight line connecting one end of the blocking plate far away from the crucible body and one end of the nozzle far away from the crucible body forms a first included angle with respective to a top surface of a nozzle exit; and a diagonal line in the cross section of the nozzle forms a second included angle with respective to the top surface of the nozzle exit, wherein, the first included angle is larger than the second included angle.

13. The evaporation device of claim 10, wherein the crucible body comprises a grid-structured division plate to divide an interior of the crucible body into a plurality of compartments and an air balance plate disposed above the division plate, wherein the division plate and the air balance plate are both formed of copper-nickel alloy material.

* * * * *